United States Patent [19]
Jenq et al.

[11] Patent Number: 5,960,280
[45] Date of Patent: Sep. 28, 1999

[54] METHOD OF FABRICATING A FIN/CAVITY CAPACITOR STRUCTURE FOR DRAM CELL

[75] Inventors: Jason Jenq, Pingtung; Sun-Chieh Chien, Hsinchu, both of Taiwan

[73] Assignee: United Microelectronics Corp., Taiwan

[21] Appl. No.: 08/975,489

[22] Filed: Nov. 21, 1997

Related U.S. Application Data

[60] Provisional application No. 60/057,477, Sep. 3, 1997.

[51] Int. Cl.$^6$ ................................................ H01L 21/8242
[52] U.S. Cl. .......................... 438/254; 438/255; 438/397; 438/398
[58] Field of Search ..................................... 438/387, 396, 438/397, 398, 399, 253, 254, 255, 256

[56] References Cited

U.S. PATENT DOCUMENTS

| | | | |
|---|---|---|---|
| 5,223,448 | 6/1993 | Su ............................................ | 438/253 |
| 5,721,152 | 2/1998 | Jenq et al. ................................ | 438/254 |
| 5,753,559 | 5/1998 | Yew et al. ................................. | 438/398 |

*Primary Examiner*—Brian Dutton
*Assistant Examiner*—Toniae M. Thomas

*Attorney, Agent, or Firm*—Rabin & Champagne, P.C.

[57] ABSTRACT

A DRAM is formed by providing a transfer FET, providing an elevated structure over and adjacent to the transfer FET and then forming a cavity above one of the source/drain regions of the transfer FET. The cavity is filled with a conductor to define in part a lower electrode of a charge storage capacitor. Portions of the cavity are then removed to expose additional charge storage surfaces for the lower electrode of the charge storage capacitor. The elevated structure includes a thick, planarized insulating layer provided over the transfer FET. A cavity is formed by providing an etching mask over the thick, planarized insulating layer with an opening positioned over the first source/drain. Etching is performed to remove a portion of the second insulating layer. A thick polysilicon layer is provided to fill the cavity and then the second, thick polysilicon layer is patterned to laterally define the lower capacitor electrode, preferably leaving portions of the second polysilicon layer extending above the stepped opening and onto surrounding portions of the second insulating layer. The second insulating layer is then removed to expose additional surfaces of the lower capacitor electrode for charge storage. Processing continues to provide a capacitor dielectric layer, an upper capacitor electrode and a bit line contact to complete the DRAM.

20 Claims, 5 Drawing Sheets

METHOD OF FABRICATING A FIN/CAVITY CAPACITOR STRUCTURE FOR DRAM CELL

This application claims priority from provisional application Ser. No. 60/057,477, filed Sep. 3, 1997.

BACKGROUND OF THE INVENTION

1. Field of the Invention

The present invention relates to the formation of high density integrated circuits and, more particularly, to the formation of high density dynamic random access memories.

2. Description of the Related Art

There is a continuing trend toward increasing the storage density of integrated circuit memories to provide increased levels of data storage on a single chip. Higher density memories provide storage that is generally more compact and is often cheaper on a per bit basis than an equivalent amount of storage provided on plural chips. It has generally been possible to provide these higher levels of storage at equivalent or improved levels of performance as compared to the earlier, less dense memory chips. Historically, the density of integrated circuit devices has been increased in part by decreasing the size of structures such as wiring lines and transistor gates as well as by decreasing the separation between the structures that make up the integrated circuit device. Reducing the size of circuit structures is generally referred to as decreasing the "design rules" used for the manufacture of the integrated circuit device.

In dynamic random access memories (DRAMs), information is typically stored by selectively charging or discharging each capacitor of an array of capacitors formed on the surface of a semiconductor substrate. Most often, a single bit of binary information is stored at each capacitor by associating a discharged capacitor state with a logical zero and a charged capacitor state with a logical one, or vice versa. The surface area of the electrodes of the memory capacitors determines the amount of charge that can be stored on each of the capacitors for a given operating voltage, for the electrode separation that can reliably be manufactured, and for the dielectric constant of the capacitor dielectric used between the electrodes of the charge storage capacitor. Read and write operations are performed in the memory by selectively coupling the charge storage capacitor to a bit line to transfer charge either to or from the charge storage capacitor. The selective coupling of the charge storage capacitor to the bit line is accomplished using a transfer field effect transistor (FET). A contact between the bit line and the transfer FET is made to one of the source/drain electrodes of the transfer FET and the charge storage capacitor is formed in contact with the other of the source/drain electrodes of the transfer FET. Word line signals are supplied to the gate of the FET to selectively connect the lower electrode of the charge storage capacitor through the transfer FET to the bit line contact, facilitating the transfer of charge between the charge storage capacitor and the bit line.

Applying reduced design rules to a DRAM reduces the substrate surface area that can be devoted to the charge storage capacitors of the DRAM. Thus, applying reduced design rules to conventional planar capacitor designs reduces the amount of charge (i.e., capacitance) that can be stored on the charge storage capacitor. Reducing the amount of charge on the capacitor leads to a variety of problems, including the potential loss of data due to greater susceptibility to decay mechanisms and to charge leakage. This greater susceptibility to charge loss may cause the DRAM to require more frequent refresh cycles, which is undesirable since the memory may be unavailable for data storage and readout transactions during refresh activities. In addition, reduced levels of charge storage might require more sophisticated data readout schemes or more sensitive charge sensing amplifiers. Thus, modern DRAMs require increased levels of capacitance in reduced substrate area DRAM cells. To this end, a variety of very complex capacitor structures having three dimensional charge storage surfaces have been proposed. In general, these complex capacitor structures are difficult to manufacture.

SUMMARY OF THE PREFERRED EMBODIMENTS

It is accordingly an object of the present invention to provide a more manufacturable DRAM incorporating an increased capacitance charge storage capacitor.

An aspect of the invention forms an integrated circuit device including a transfer FET having a gate electrode and a source/drain region and including a wiring line spaced from the gate electrode. A first conductive layer is provided over the gate electrode, the source/drain region and the wiring line, where the first conductive layer is spaced from the gate electrode and the wiring line and the first conductive layers connected to the source/drain region. The process continues by depositing and planarizing an insulating layer over the first conductive layer, with the insulating layer being deposited to a sufficient thickness so that a surface of the planarized insulating layer extends above the first conductive layer over the gate electrode. An opening is formed in the planarized insulating layer extending from the surface of the planarized insulating layer to expose at least part of the first conductive layer. A second conductive layer is provided to fill the opening in the planarized insulating layer so that the second conductive layer extends over the surface of the planarized insulating layer. An etching mask is provided over the second conductive layer and etching is performed through the second conductive layer to form a patterned second conductive layer having edges on the surface of the planarized insulating layer. The planarized insulating layer is removed from around the patterned second conductive layer and the first conductive layer is patterned. A dielectric layer is provided over exposed surfaces of the first conductive layer and the patterned second conductive layer. An upper capacitor electrode is provided.

According to another aspect of the invention, an integrated circuit device is formed which includes a transfer FET on a substrate, the transfer FET having a gate electrode and first and second source/drain regions. A wiring line is provided spaced from the gate electrode so that the first source/drain region is positioned between the gate electrode and the wiring line. A first insulating layer is provided over the gate electrode, the wiring line, and the first and second source/drain regions. A portion of the first insulating layer is removed to expose a surface of the first source/drain region. A first layer of polysilicon is provided over a remaining portion of the first insulating layer and on the surface of the first source/drain region. The process continues by depositing and planarizing a second insulating layer over the first conductive layer, with the second insulating layer being deposited to a sufficient thickness so that a surface of the planarized insulating layer extends above the first polysilicon layer over the gate electrode and so that the surface of the planarized insulating layer extends above the first polysilicon layer over the wiring line. An opening is formed in the planarized insulating layer extending from the surface of the planarized insulating layer to expose at least part of the first layer of polysilicon. A second layer of polysilicon is provided to fill the opening in the planarized insulating layer, the second layer of polysilicon extending over the surface of the planarized insulating layer. An etching mask is provided over the second layer of polysilicon, with edges of an element of the etching mask positioned over the gate electrode and the wiring line, and using the etching mask, etching is performed through the second layer of polysilicon to form a patterned second polysilicon layer having edges on the surface of the planarized insulating layer. The planarized insulating layer is removed from around the patterned second polysilicon layer and the first conductive layer is patterned using the etching mask. A dielectric layer is provided over exposed surfaces of the first conductive layer and the patterned second conductive layer and an upper capacitor electrode is provided.

DETAILED DESCRIPTION OF THE PREFERRED EMBODIMENTS

Figure 1:
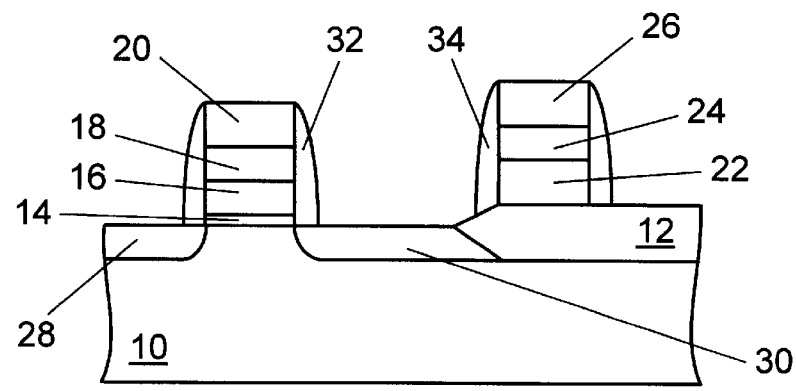
FIGS. 1–11 illustrate steps in forming a DRAM in accordance with preferred embodiments of the present invention.
Figure 2:
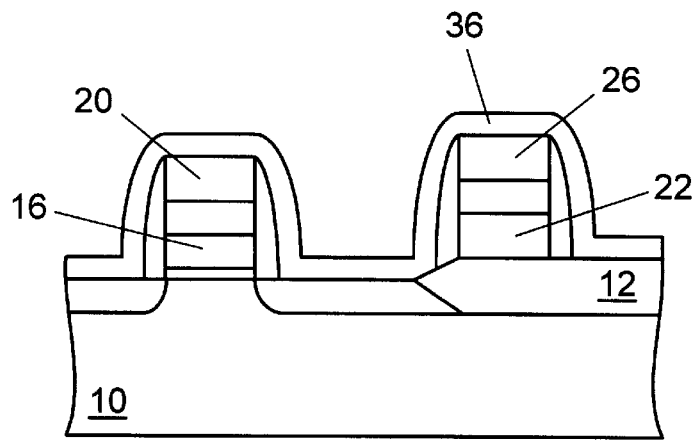

Aspects of the present invention form a cavity above one of the source/drain regions of a transfer FET of a DRAM cell and fill in that cavity with a conductor to define in part a lower electrode of a charge storage capacitor for the DRAM cell. Portions of the structure defining the cavity are then removed to expose additional charge storage surfaces for the lower electrode of the charge storage capacitor. In accordance with a particularly preferred embodiment of the present invention, a transfer FET is provided on a substrate and the transfer FET is covered by a first insulating layer. A self aligned contact etch removes a portion of the first insulating layer from above a first source/drain region of the FET and then a first polysilicon layer is deposited on the surface of the device in contact with the first source/drain region. The first polysilicon layer extends over the gate electrode and the wiring line, defining a locally cupped surface connected to the first source/drain region of the transfer FET. A thick, planarized second insulating layer is provided over the device, filling the volume defined by the locally cupped surface. An etching mask is provided over the second insulating layer with an opening positioned over the first source/drain region, and then etching is performed to remove a portion of the second insulating layer. This etching step exposes a portion of the locally cupped surface of the first polysilicon layer and forms a stepped opening in the second insulating layer around the locally cupped surface to provide a cavity above the first source/drain region. A second, thick polysilicon layer is provided to fill the cavity and then the second, thick polysilicon layer is patterned to laterally define the lower capacitor electrode, preferably leaving portions of the second polysilicon layer extending above the stepped opening and onto surrounding portions of the second insulating layer. The second insulating layer is then removed to expose additional surfaces of the lower capacitor electrode for charge storage. Still additional surface area can be provided by incorporating further processing of the lower gate electrode.

Preferred embodiments of the present invention provide a DRAM having an array of high capacitance charge storage capacitors formed in an efficient process flow which includes process limits to improve the yields from high failure rate process steps, including such process steps as long duration, time controlled etching steps. For example, in the long etching step used to remove a portion of the second insulating layer to form the cavity, the first polysilicon layer acts as a localized etch stop for the insulator etching process. In addition, this process step is stopped well short of the point in the processing in which the bottom of the first polysilicon layer is exposed to the etching environment. These and other aspects of the present invention are now described in greater detail with particular reference to FIGS. 1–11 . Many aspects of the manufacture of DRAMs are conventional and well known to those practicing in the art. As such, the following discussion omits certain of the details of the manufacturing process and presents in summary still other aspects of the manufacturing process to better emphasize the distinctive teachings of the present invention.

FIG. 1 shows in schematic cross-section an illustrative cell of the many cells of a DRAM at an intermediate stage of manufacture in accordance with the present invention. The exemplary DRAM cell is formed on a P-type substrate 10 which has on its surface an array of field oxide device isolation regions 12 that provide isolation between the various memory cells and devices of the DRAM. The device isolation regions might be formed using a modified local oxidation of silicon (LOCOS) method, as schematically illustrated, or might be formed as shallow trench isolation structures. Shallow trench isolation structures might be formed by etching trenches into the substrate, refilling the trenches with oxide in a chemical vapor deposition (CVD) process, and planarizing the surface of the device in a chemical mechanical polishing (CMP) process.

Formation of the exemplary DRAM continues by providing a multilayer stack consisting of a gate oxide layer 14 on the active device regions, a layer of conductive material including at least a layer of doped polysilicon over the substrate, followed by a protective dielectric layer. Particular materials are identified here to more effectively illustrate embodiments of the invention, but it should be understood that other individual materials and other combinations of at least some of these materials might well be used instead to implement the general methods of the present invention. The gate oxide layer 14 is grown on the surface of the substrate to a typical thickness of about 30–200 Å by thermal oxidation in an oxygen environment at a temperature of 800–1000° C. Gate oxide layer 14 covers all of the active device regions defined between the field oxide device isolation regions 12. Soon after the gate oxide layer is grown, a first layer of polysilicon is deposited by low pressure chemical vapor deposition (LPCVD) over the surface of the device to a thickness of 1000–3000 Å and more preferably to a thickness of approximately 1500–2500 Å. This first polysilicon layer will be incorporated into the gate electrodes of the transfer FETs and the wiring lines that extend between the gate electrodes of adjacent cells. The gate electrode polysilicon layer is either doped in situ during deposition or by ion implantation, typically using arsenic or phosphorus, followed by annealing in the conventional fashion. A layer of a metal or metal silicide might then be provided over the surface of the polysilicon layer to reduce the resistivity of the gate electrode and wiring line conductors. The metal layer is preferably tungsten silicide ($WSi_x$) or titanium silicide ($TiSi_x$) having a thickness of about 1500 Å which is preferably deposited directly by chemical vapor deposition or by using sputtering or another physical vapor deposition technique. It should be noted that both more and less complicated gate electrode and wiring line structures might be used. A protective oxide layer is next provided over the conductive layers to a thickness of about 1000 Å or more by CVD or a comparable method. The oxide protective layer primarily serves to protect the gate electrode during subsequent processing steps.

After the multilayer stack of FIG. 1 is formed, a photoresist etch mask (not illustrated) is provided on the surface of the oxide layer and etching is performed through the various layers of the multilayer stack. Etching through the preferred protective oxide layer is accomplished using, for example, reactive ion etching (RIE) with a $CF_4$ source gas. Etching through the silicide layer can be accomplished in an RIE process using etchants derived from $Cl_2$ or HCl source gases. Etching through the polysilicon layer 16 is accomplished by RIE or another plasma etching process using a chlorine etch chemistry or using an etchant derived from HCl and HBr source gases. Although it is possible that the gate oxide layer 14 will be etched through at the end of the polysilicon etching process, additional oxide will generally grow on the surface of the substrate during a subsequent ion implantation and annealing process. After the various layers are etched through, a pattern of gate electrodes including a first polysilicon layer 16 covered by a like patterned silicide layer 18 is provided and covered by patterned protective oxide layers 20. Similar multilayer wiring line structures including a polysilicon layer 22, a silicide layer 24 and a capping oxide layer 26 are formed at the same time that the gate electrode structure is formed.

Doped source/drain regions 28, 30 are formed on either side of the polysilicon gate electrode to define the channel region of the transfer transistor. In some instances, a lightly doped drain (LDD) structure might be used in small design rule memory transistors of the type that are primarily used in modern memory and logic devices. LDD source/drain regions are typically formed in a two step process, beginning with a relatively low level dopant implantation made self-aligned to the gate electrode structure. Subsequently, spacer oxide regions 32 can be formed on either side of the gate electrode by first depositing a layer of CVD oxide over the device and then anisotropically etching back the oxide layer to expose the substrate over the source/drain regions 28, 30. Etching back the CVD oxide layer produces the spacer oxide structures 32 on either side of the polysilicon gate electrode 16 and spacer oxide structures on either side of the polysilicon wiring line 22. After the spacer oxide regions 32 are provided on either side of the polysilicon gate electrode 16, a second, heavier ion implantation is made into the source/drain regions 28, 30, self-aligned to the spacer oxide regions 32. In most modern high density DRAM applications, however, it is preferred to not utilize an LDD structure for the source/drain regions, particularly for the capacitor contacts, and instead to use a single doping to produce more uniformly doped source/drain regions. Moderately doped source/drain regions 28, 30 might then be formed by ion implantation self-aligned to the gate electrodes. For example, the source/drain regions might be formed by implanting arsenic or phosphorus ions at an energy of 30–100 KeV to a dosage of between about $1\times10^{13}/cm^2$ to $1\times10^{14}/cm^2$. For these presently preferred alternate embodiments, it is nevertheless preferred that the spacer structures 32, 34 be provided alongside the gate electrodes and wiring lines, as illustrated in FIG. 1, to provide protection to the gate electrodes and wiring lines during subsequent processing steps.

Figure 3:
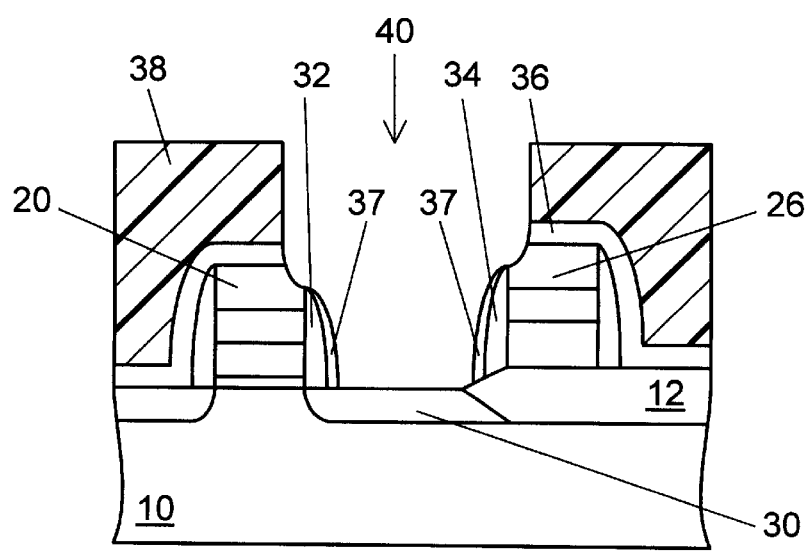

After the transfer FETs and wiring lines are formed, a layer of oxide 36 (FIG. 2) is deposited in a lower pressure chemical vapor deposition (LPCVD) process from a TEOS source gas to a thickness of about 1000 Å. The oxide layer 36 deposited in this fashion will cover the gate electrode structure and wiring line structure in an essentially conformal manner. This oxide layer provides a protective barrier and etch stop layer for portions of the device during the formation of the lower capacitor electrode structure. The capacitor contact opening is defined by providing an etch mask 38 having an opening 40 positioned over the source/drain region 30 on which the lower capacitor electrode will be formed. The opening 40 in the etch mask is preferably larger than the source/drain region 30 and larger than the minimum spacing between the gate electrode and wiring line. By providing such a wide opening, the capacitor contact opening can be formed in a self-aligned etch back process. The etch back step may be performed, for example, in a Tokyo Electron dielectric etching system such as the TEL 8500 using an etchant derived in a plasma process from a source gas such as $CF_4$. Etching continues through the CVD oxide layer 36 until the surface of the source/drain region 30 is exposed and cleared of oxide, as shown in FIG. 3. Typically, additional thin oxide spacer structures 37 are formed alongside spacers 32, 34 in this etch back process and provide further insulation around the gate electrode to reduce the likelihood of shorting between the gate electrode and the lower capacitor electrode. Because these spacer structures are very similar to the corresponding oxide spacers 32, 34 formed alongside the gate electrode and the wiring lines, spacers 37 are not shown separately from the spacers 32, 34 in the remaining figures. The photoresist etch mask is then stripped or removed by ashing.

Formation of the lower capacitor electrode proceeds by depositing a second layer of polysilicon over the device so that the second layer of polysilicon 42 is in contact with the source/drain region 30 to which the capacitor electrode is connected but is insulated from the source/drain region 28 to which the bit line is connected. The second polysilicon layer 42 can be deposited to a thickness of approximately 1000 Å in a LPCVD process. The second polysilicon layer 42 is doped either in situ during deposition or by subsequent ion implantation and annealing. Preferably, the doping level for the second polysilicon layer 42 is comparatively high because it will be used to connect the source/drain region 30 to other portions of the capacitor electrode.

Figure 4:
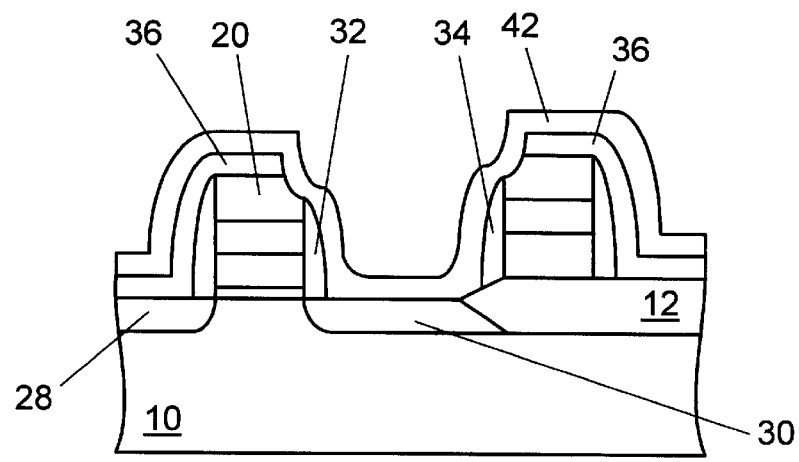
Figure 5:
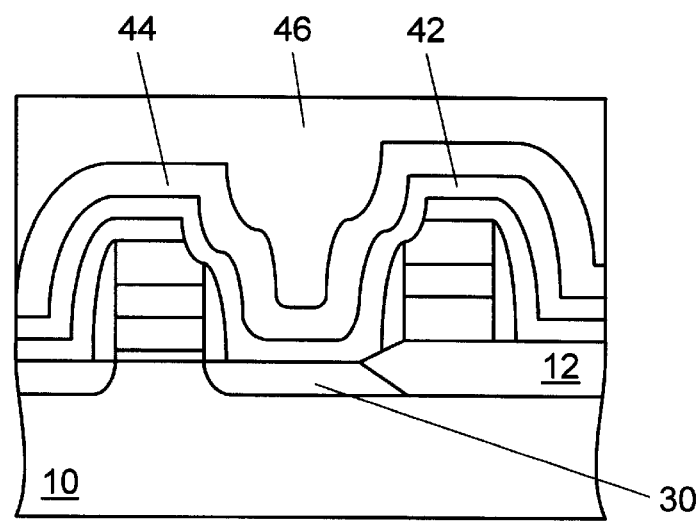

Next, a planarized oxide layer is provided over the FIG. 4 structure, preferably using a series of oxide deposition steps that readily provide a planarized surface in a reliable and manufacturable process. One component of the thick oxide layer is an approximately 1500 Å thick layer of oxide 44 deposited in an atmospheric pressure chemical vapor deposition (APCVD) process. The APCVD oxide layer 44 is preferably undoped and provides a conformal oxide layer that should not flow in a subsequent reflow process. Next, a layer of boron phosphorus silicate glass 46 is deposited to a thickness of approximately 7500 Å. The BPSG oxide layer 46 has doping levels appropriate to allow the layer to readily reflow. Next, the device is provided to a reflow furnace at a temperature of about 800° C. for between about 20 minutes to one hour to allow the BPSG layer 46 to reflow, at least partially planarizing the device. Further planarization is accomplished by providing a layer of spin-on-glass (SOG) or, more preferably, plural layers of SOG with annealing steps between the deposition of successive layers. A total SOG layer thickness of about 2700 Å is appropriate to achieve the desired level of planarization for the surface of the multilayer oxide structure. Finally, the multilayer oxide structure is subjected to an etch back process in which approximately 10,000 Å of oxide are removed from the surface of the device in a blanket etching process. An appropriate etching process might be performed in the TEL 8500 system using a $CF_4$ source gas, or another high rate dielectric etching process. By etching approximately 10,000 Å of oxide from the surface of the device, the SOG layer will be completely removed and substantially all of the BPSG layer will be removed. The resulting structure is shown in FIG. 5, and it can be seen that the BPSG layer 46 has a substantially planar surface. This planarized oxide layer can now be used in forming a vertical step adjacent the capacitor electrode contact which will provide additional height and surface area for the lower capacitor electrode formed in accordance with particularly preferred embodiments of the present invention.

Figure 6:
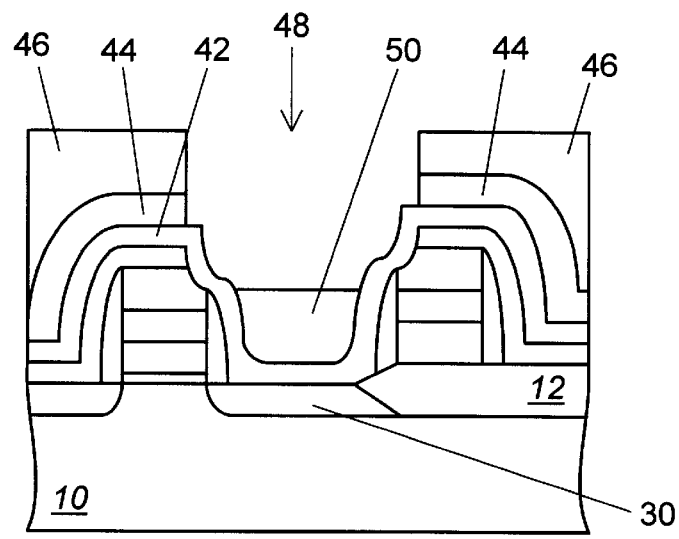

FIG. 6 shows the planarized oxide layer after a step structure has been formed in the oxide layer with an opening exposing the contact opening area 48. This step structure is formed by first providing a photoresist etch mask over the surface of the FIG. 5 structure having an opening generally wider than the first etch mask illustrated in FIG. 3. An oxide etching process is then performed to remove oxide. This oxide etching process may be performed in the same manner discussed above and is preferably continued until it exposes a significant portion of polysilicon layer 42. It is important to note that it is not necessary to continue this etching process until all of the oxide layer 50 is removed from the surface of polysilicon layer 42 adjacent the source/drain electrode 30. It is in fact preferred that this etching process stop significantly short of completely removing oxide layer 50 both to reduce the time required in the oxide etcher and thus in the overall process flow and also to avoid etching damage to the polysilicon layer 42 immediately adjacent the source/drain region 30. Since, in accordance with particularly preferred embodiments of the present invention, the inner surface of polysilicon layer 42 is not used as a charge storage surface for the DRAM charge storage capacitor, it is not necessary that the oxide layer 50 be completely removed. The second etching mask is then stripped to produce the structure shown in FIG. 6. As illustrated, the remaining portion of the BPSG layer 46, if any, and the remaining portion of the undoped CVD oxide layer 44 define an opening having substantially vertical sidewalls extending above the polysilicon layer 42 and the etched oxide plug 50. This stepped opening provides vertical height and additional surface area for the lower capacitor electrode.

A third layer of polysilicon is then deposited over the surface of the FIG. 6 device. Preferably, a thick layer of polysilicon on the order of approximately 5000 Å or more is deposited in an LPCVD process. This thick polysilicon layer 52 fills the opening within polysilicon layer 42 and extends above the step in the planarized oxide layer and over the surface of the planarized oxide layer 46. Generally, the polysilicon layer deposited in this fashion will have a substantially planar upper surface. If this is not the case, then it is preferred that this surface be planarized in either an etch back process or a chemical mechanical polishing process. The thick polysilicon layer 52 is preferably doped in situ during deposition to avoid the possibly prolonged annealing process that might be required if ion implantation or diffusion were used to dope the thick polysilicon layer 52.

Figure 7:
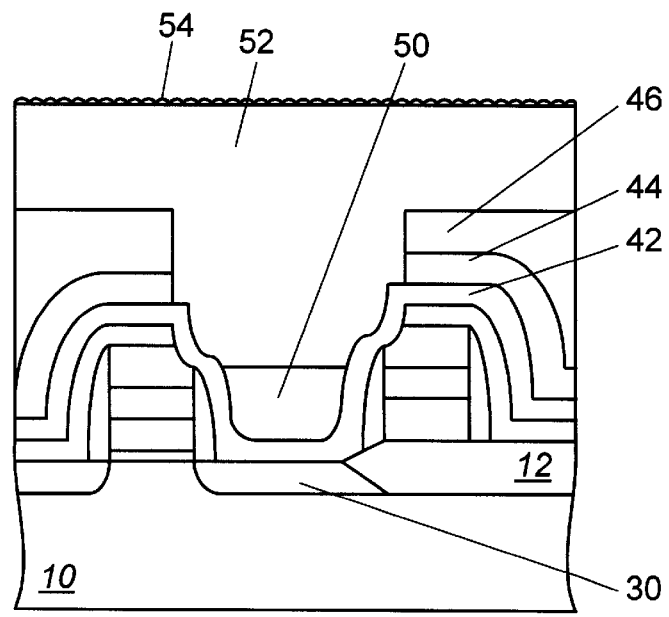
Figure 8:
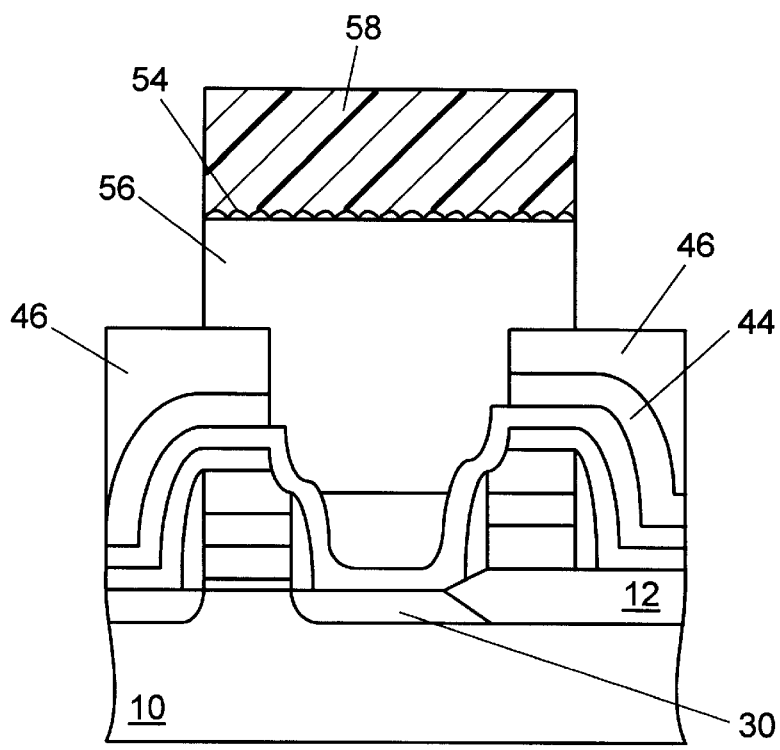
Figure 9:
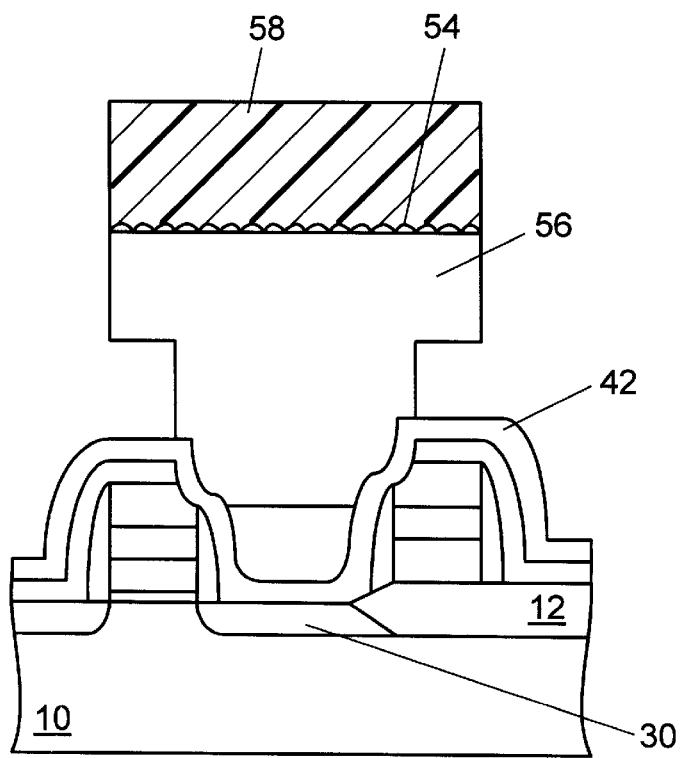

To further improve the charge storage characteristics of the DRAM capacitor electrode of the present invention, it is preferred that a layer of hemispherical grained silicon (HSG-Si) be provided on the surface of the thick polysilicon layer 52. As is known in the art, hemispherical grained silicon, also known as textured polysilicon, can be deposited on a silicon surface in an LPCVD process in which the deposition substrate temperature is maintained at about 555° C. to about 590° C. This process is preferably continued to deposit approximately 80–100 nanometers of hemispherical grained silicon to form layer 54 as illustrated in FIG. 7. The resulting layer of hemispherical grained silicon will have grain sizes on the order of 80–100 nanometers with grain separations on the order of 80–100 nanometers. This hemispherical grained silicon layer 54 can be doped by ion implantation or by subsequent diffusion from the thick polysilicon layer 52. Alternately, an etch back process might be performed on the surface 54 to transfer the topology of the hemispherical grained silicon surface layer to the underlying polysilicon layer.

Figure 10:
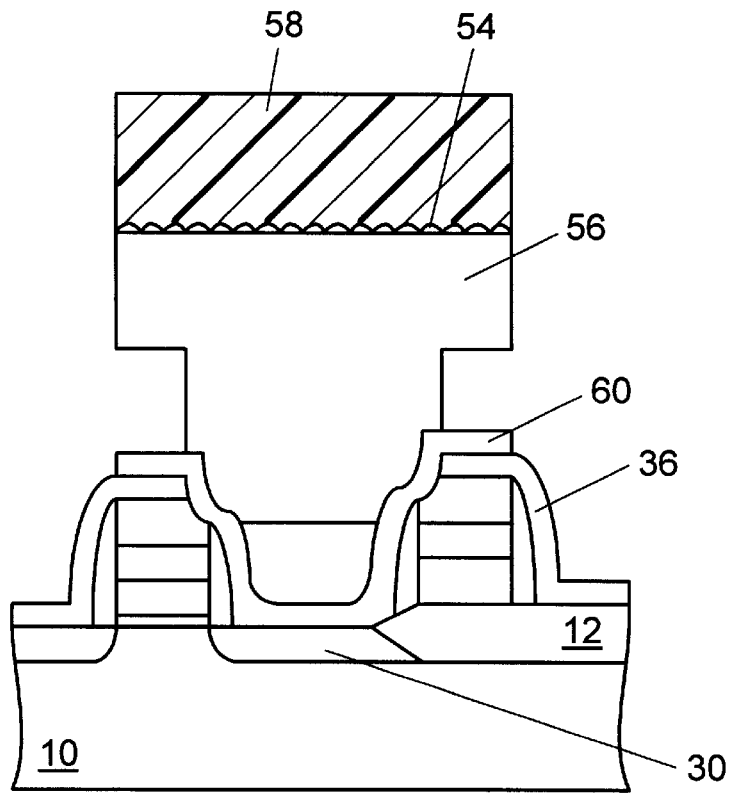
Figure 11:
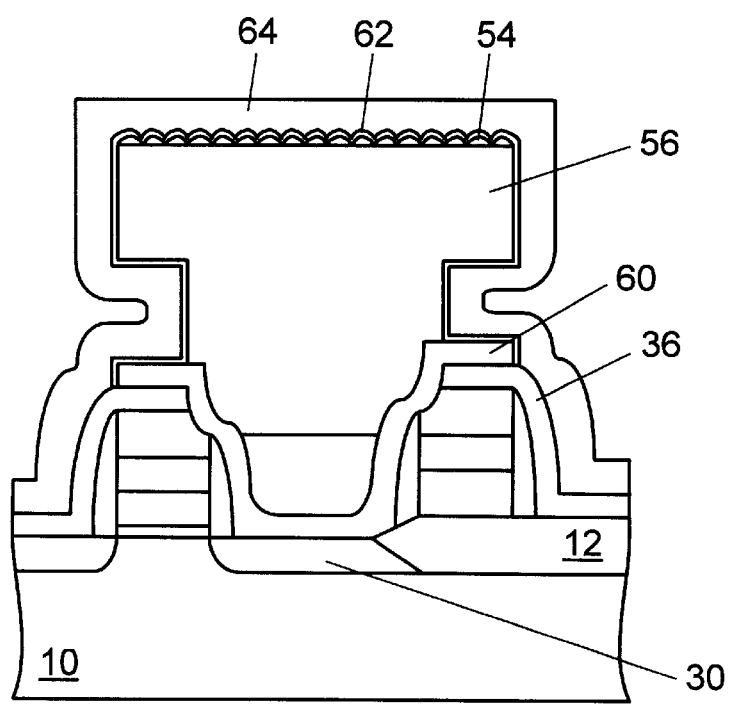

The process now laterally defines the lower capacitor electrode for the illustrated DRAM cell. A polysilicon etch mask 58 is provided on the surface of the hemispherical grained silicon layer 54, where the photoresist mask extends over the planarized oxide layer 46 on either side of the step. A conventional polysilicon etching process, for example using an Applied Materials Precision 5000 etching system with an etchant derived from a mixture of source gases including HCl and HBr, is performed to etch first the hemispherical grained silicon layer 54 and then to etch through the thick polysilicon layer 52, stopping the etching process on the planarized upper surface of oxide layer 46. Most preferably, the patterned thick polysilicon layer 56 extends over the stepped opening in the planarized oxide layer 46 and laterally on either side above the planarized oxide layer. Next, the oxide layers 46 and 44 are removed from the FIG. 8 structure, preferably while leaving the photoresist mask 58 in place. These oxide layers may be removed in a buffered oxide etch (BOE) with a 20:1 dilution for approximately ten minutes or, alternately in a dilute hydrofluoric acid solution. This oxide wet etching process stops on the surface of polysilicon layer 42 and preferably does not attack the photoresist mask 58. Next, the FIG. 9 structure is returned to the polysilicon etching system and the polysilicon layer 42 is etched using anisotropic etching as described above with the photoresist mask 58 defining the extent of the etching step. This etching process defines polysilicon layer 60 that forms an additional charge storage surface for the DRAM capacitor, as shown in FIG. 10. Finally, the photoresist mask 58 is stripped or otherwise removed.

Next, a layer of capacitor dielectric material 62 (FIG. 11) is provided over all of the exposed surfaces of the lower charge storage capacitor electrode. A capacitor dielectric material might be provided by depositing a thin layer of (~30–50 Å) of CVD silicon nitride and growing a thin layer of oxide (~5–15 Å) on the nitride layer to form the dielectric material known as "NO." In alternate embodiments of the present invention, a higher dielectric constant capacitor dielectric material is chosen. In an alternate embodiment, a layer of tantalum pentoxide, nominally $Ta_2O_5$, is deposited in a chemical vapor deposition (CVD) process from a source gas mixture consisting of $Ta(OC_2H_5)_5+O_2$. The tantalum pentoxide capacitor dielectric might be deposited in a high density deposition system such as the LAM 9800 Integrity system to a thickness of between about 20–140 Å. The particular thickness chosen for the capacitor dielectric is preferably thin to maximize the resulting capacitance but sufficiently thick to ensure that the capacitor dielectric layer 62 does not have unacceptable pin holes or an unacceptable breakdown voltage. Because the preferred capacitor dielectric layer is deposited at least in part by CVD, the capacitor dielectric layer 62 will typically extend over the surfaces of the device that are exposed during this dielectric formation process.

An upper capacitor electrode 64 is next formed over the DRAM structure in accordance with preferred embodiments of the present invention. For most embodiments, the upper capacitor electrode 64 includes a layer of doped polysilicon deposited to a thickness of 1500–2500 Å. When a tantalum pentoxide capacitor dielectric is used, it is preferred that titanium nitride (TiN) be used to form at least the lower surface of the upper capacitor electrode. Most often, the entire upper capacitor electrode can be formed from titanium nitride due to the high conductivity of titanium nitride. Most preferably, the titanium nitride is deposited over the capacitor dielectric in a low temperature process. Such a low temperature process is preferred because the high dielectric constant capacitor dielectrics preferably used in the present invention typically include oxygen as a constituent element. Thus, any high temperature processes can cause oxide to form at the surface of the lower capacitor electrode. Any such oxide layer formed will constitute a reduced capacitance in series with the capacitance provided by the high dielectric constant material, which would undesirably reduce the capacitance of the DRAM charge storage capacitor. Accordingly, the titanium nitride layer is preferably deposited to a thickness of 1000 Å or less using a sputtering process and a relatively low substrate temperature or, more preferably, the titanium nitride layer is deposited in a metal organic chemical vapor deposition (MOCVD) process. Titanium nitride can be deposited by MOCVD from $TiCl_4+NH_3$ source gases at a comparatively low substrate temperature. The MOCVD process has the further advantage over sputtering that MOCVD is much less likely to heat the deposition substrate during the deposition process.

The upper capacitor electrode 64 is then patterned to remove the upper capacitor electrode from above the source/drain region 28 that forms part of the bit line contact. Processing continues to cover the upper capacitor electrode 64 with an interlayer insulating layer, for example by depositing boron phosphorus silicate glass (BPSG) in a CVD process. A bit line contact opening is then formed through the interlayer insulating layer and the contact opening is filled with a metal interconnect and a metal bit line is provided. Further conventional processing is performed to complete the formation of the DRAM cell and support circuitry.

The present invention has been described in terms of certain preferred embodiments. Those of ordinary skill in the art will appreciate that certain modifications and variations on the embodiments described herein may be made within the general spirit of the present invention. As such, the scope of the present invention is not to be limited to the particular embodiments described herein. Rather, the scope of the present invention is to be determined from the claims which follow.

What is claimed:

1. A method of making an integrated circuit device comprising the steps of:

providing a transfer FET having a gate electrode and a source/drain region and providing a wiring line spaced from the gate electrode;

depositing a first conductive layer over the gate electrode, the source/drain region and the wiring line, the first conductive layer spaced from the gate electrode and wiring line, the first conductive layer connected to the source/drain region;

depositing and planarizing an insulating layer over the first conductive layer, the insulating layer being deposited to a sufficient thickness so that a surface of the planarized insulating layer extends above the first conductive layer over the gate electrode;

forming an opening in the planarized insulating layer extending from the surface of the planarized insulating layer to expose at least part of the first conductive layer;

providing a second conductive layer to fill the opening in the planarized insulating layer, the second conductive layer extending over the surface of the planarized insulating layer;

providing an etching mask over the second conductive layer and etching through the second conductive layer to form a patterned second conductive layer having edges on the surface of the planarized insulating layer;

removing the planarized insulating layer from around the patterned second conductive layer;

patterning the first conductive layer;

providing a dielectric layer over exposed surfaces of the first conductive layer and the patterned second conductive layer; and providing an upper capacitor electrode;

wherein each of the steps are performed in the order given.

2. The method of claim 1, wherein the step of forming an opening does not expose the entire surface of the first conductive layer within the opening and wherein the second conductive layer and the first conductive layer are separated in part by a remaining portion of the planarized insulating layer.

3. The method of claim 1, wherein the patterned second conductive layer extends on the surface of the planarized insulating layer on either side of the opening in the planarized insulating layer.

4. The method of claim 1, further comprising the step of forming textured polysilicon on a surface of the second conductive layer.

5. The method of claim 4, wherein the textured polysilicon is formed in a chemical vapor deposition process at a substrate temperature of between about 555° C. to about 590° C.

6. The method of claim 1, wherein the step of removing the planarized insulating layer is an etching process that stops on the first conductive layer.

7. The method of claim 6, wherein the planarized insulating layer comprises an oxide and the first conductive layer comprises doped polysilicon.

8. The method of claim 6, wherein the step of removing the planarized insulating layer comprises a wet etching process.

9. The method of claim 1, wherein the planarized insulating layer is formed by depositing a first layer of undoped oxide and then depositing a layer of doped oxide over the layer of undoped oxide.

10. The method of claim 9, further comprising the step of heating the layer of doped oxide to a sufficient extent to cause at least a surface of the layer of doped oxide to reflow.

11. The method of claim 1, wherein the step of planarizing the insulating layer includes providing at least one layer of spin on glass.

12. The method of claim 11, wherein the at least one layer of spin on glass is deposited on a reflowed surface of a doped oxide layer.

13. The method of claim 12, wherein the doped oxide layer is boron phosphorus silicate glass.

14. The method of claim 1, wherein the first conductive layer is patterned in an etching process using the etching mask used to etch the second conductive layer.

15. The method of claim 14, wherein the first conductive layer and the second conductive layer comprise polysilicon.

16. The method of claim 15, wherein the planarized insulating layer comprises silicon oxide.

17. A method of forming an integrated circuit device, the method comprising:

provenance a transfer FET on a substrate, the transfer FET having a gate electrode and first and second source/drain regions;

providing a wiring line spaced from the gate electrode, the first source/drain region positioned between the gate electrode and the wiring line;

providing a first insulating layer over the gate electrode, the wiring line, and the first and second source/drain regions;

removing a portion of the first insulating layer to expose a surface of the first source/drain region;

depositing a first layer of polysilicon over a remaining portion of the first insulating layer and on the surface of the first source/drain region;

depositing and planarizing a second insulating layer over the first layer of polysilicon, the second insulating layer being deposited to a sufficient thickness so that a surface of the planarized insulating layer extends above the first polysilicon layer over the gate electrode and so that the surface of the planarized insulating layer extends above the first polysilicon layer over the wiring line;

forming an opening in the planarized insulating layer extending from the surface of the planarized insulating layer to expose at least part of the first layer of polysilicon;

providing a second layer of polysilicon to fill the opening in the planarized insulating layer, the second layer of polysilicon extending over the surface of the planarized insulating layer;

providing an etching mask over the second layer of polysilicon, edges of an element of the etching mask positioned over the gate electrode and the wiring line, and using the etching mask, etching through the second layer of polysilicon to form a patterned second polysilicon layer having edges on the surface of the planarized insulating layer;

removing the planarized insulating layer from around the patterned second polysilicon layer;

patterning the first conductive layer using the etching mask;

providing a dielectric layer over exposed surfaces of the first lyer of polysilicon and the patterned second polysilicon layer; and providing an upper capacitor electrode;

wherein each of the steps are performed in the order given.

18. The method of claim 17, wherein the step of forming an opening does not expose the entire surface of the first layer of polysilicon within the opening and wherein the second layer of polysilicon and the first layer of polysilicon are separated in part by a remaining portion of the planarized insulating layer.

19. The method of claim 17, wherein the planarized insulating layer comprises silicon oxide.

20. The method of claim 17, wherein the step of patterning the first conductive layer stops on a portion of the first insulating layer above the second source/drain region.

* * * * *